(12) United States Patent
Kurisu

(10) Patent No.: US 7,339,399 B2
(45) Date of Patent: Mar. 4, 2008

(54) ANTI-NOISE INPUT/OUTPUT IMPEDANCE CONTROL OF SEMICONDUCTOR CIRCUIT WITH REDUCED CIRCUIT SIZE

(75) Inventor: Masakazu Kurisu, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 56 days.

(21) Appl. No.: 11/473,026

(22) Filed: Jun. 23, 2006

(65) Prior Publication Data

US 2006/0290557 A1 Dec. 28, 2006

(30) Foreign Application Priority Data

Jun. 24, 2005 (JP) ............... 2005-185524

(51) Int. Cl.
*H03K 17/16* (2006.01)
*H03K 19/01* (2006.01)
(52) U.S. Cl. ............... 326/30; 326/26; 326/32
(58) Field of Classification Search ............ 326/26–27, 326/30; 327/108, 112
See application file for complete search history.

(56) References Cited

U.S. PATENT DOCUMENTS 7,038,486 B2 * 5/2006 Aoyama et al. ............ 326/30

2006/0006903 A1 * 1/2006 Choi et al. .................... 326/30

FOREIGN PATENT DOCUMENTS

| JP | 2001-94409 A | 4/2001 |
| JP | 2004-32721 A | 1/2004 |
| JP | 2005-26890 A | 1/2005 |

* cited by examiner

*Primary Examiner*—Anh Q. Tran
(74) *Attorney, Agent, or Firm*—Sughrue Mion, PLLC

(57) ABSTRACT

An impedance control system is composed of a target circuit having a controllable impedance; a replica circuit having a structure identical to the target circuit; a first binary counter providing the replica circuit with a first impedance control code indicative of a counter value of the first binary counter for controlling an impedance of the replica circuit; a comparator comparing a voltage received from the replica circuit with a reference signal; a second binary counter responsive to an output signal from the comparator for being counted up or down; and a control circuit extracting upper multiple bits out of a counter value of the second binary counter, and generating a second impedance control code indicative of the upper multiple bits. The impedance of the target circuit is controlled in response to the second impedance control code.

15 Claims, 3 Drawing Sheets

Fig. 3

| COUNTER VALUE OF 3-BIT BINARY COUNTER | COMPARATOR OUTPUT | | | |
|---|---|---|---|---|
| | 1ST SCANNING | 2ND SCANNING | 3RD SCANNING | 4TH SCANNING |
| 000b | 1 | 1 | 1 | 1 |
| 001b | 1 | 1 | 1 | 1 |
| 010b | 1 | 1 | 1 | 1 |
| 011b | 1 | 1 | 1 | 0 |
| 100b | 0 | 1 | 0 | 1 |
| 101b | 0 | 0 | 1 | 0 |
| 110b | 0 | 0 | 0 | 0 |
| 111b | 0 | 0 | 0 | 0 |
| NUMBER OF OUTPUTS OF DATA "1" | 4 | 5 | 5 | 4 |
| TOTAL NUMBER OF OUTPUTS OF DATA "1" | 18 | | | |
| COUNTER VALUE OF 5-BIT BINARY COUNTER | 10010b | | | |
| UPPER 3 BITS (FORWARDED TO TARGET CIRCUITS) | 100b | | | |

ANTI-NOISE INPUT/OUTPUT IMPEDANCE CONTROL OF SEMICONDUCTOR CIRCUIT WITH REDUCED CIRCUIT SIZE

BACKGROUND OF THE INVENTION

1. Field of the Invention

The present invention relates to circuits and method of input/output impedance control of semiconductor devices.

2. Description of the Related Art

Impedance matching between a semiconductor device and a transmission line has become increasingly important in high-speed interfacing such as SerDes ("serializer/deserializer") due to the recent increase in the operating speed of the semiconductor device.

One conventional approach is to use a transistor or a resistor integrated within a semiconductor device as a terminating resistor. However, terminating resistors composed of a transistor or a resistor integrated within a semiconductor device suffer from fluctuations and/or variations of the resistance thereof, due to the manufacturing variations, power supply voltage fluctuations, and temperature fluctuations. The fluctuations and variations of the resistances of terminating resistors undesirably cause impedance mismatch between a semiconductor device and a transmission line connected to the semiconductor device, resulting in undesirable signal reflection. This undesirably restricts the maximum operating frequency of the semiconductor device and the maximum signal transmission distance.

One approach for solving the above-described problem is to integrate an impedance control circuit that achieves impedance matching through controlling an output impedance of a driver and/or an input impedance of a receiver.

Japanese Laid-Open Patent Application No. Jp-A 2001-94409 discloses an impedance control circuit for controlling an output impedance of an output buffer. The disclosed impedance control circuit is composed of NMOS and PMOS transistor arrays each having a controllable impedance, first and second counters, first and second comparators. The first comparator compares a voltage developed across the NMOS transistor array with a reference voltage generated by voltage dividing using serially connected external transistors. The first counter is counted up in response to the output of the first comparator. The counter value of the first counter is fed to the NMOS transistor array and used for controlling the impedance of the NMOS transistor array. Correspondingly, the second comparator compares a voltage developed across the PMOS transistor array with the reference voltage. The second counter is counted up in response to the output of the second comparator. The counter value of the second counter is fed to the PMOS transistor array and used for controlling the impedance of the PMOS transistor array. The number of activated pull-down transistors within the output buffer is controlled in response to the counter value of the first counter, while the number of activated pull-up transistors within the output buffer is controlled in response to the counter value of the second counter. This achieves improved impedance control of the output buffer.

Japanese Laid-Open Patent application No. Jp-A 2005-26890 discloses a similar impedance control circuit that additionally includes an NMOS arbitration circuit, and a PMOS arbitration circuit. The NMOS arbitration circuit detects the output level of the first comparator for each counter value of the first counter three times or more, and performs majority operation on the detected output levels. The NMOS arbitration circuit allows the first counter to be counted up or down on the basis of the result of the majority operation. The PMOS arbitration circuit operates correspondingly to allow the second counter to be counted up or down.

Japanese Laid-Open Patent Application No. Jp-A 2004-32721 discloses an impedance control circuit for generating a thermometer code used for impedance control. In this impedance control circuit, a comparator compares a voltage generated by voltage dividing using an impedance-controllable circuit with a reference voltage. The output signal of the comparator is fed to an up-down counter, and used for controlling the counting up or down of the counter. The impedance of the impedance-controllable circuit is controlled in response to the counter value of the up-down counter. The counter value of the up-down counter is also fed to an averaging circuit, and the thermometer code is generated in response to the output of the averaging circuit. The averaging circuit is composed of a set of synchronization circuits and adder circuits.

FIG. 1 illustrates an exemplary structure of a typical conventional impedance system 1. An external reference resistor 9 having a highly accurate resistance is connected to a pad 8 and a power supply terminal 10. A comparator 5 compares a voltage generated through voltage dividing by the external reference resistance 9 and a replica circuit 7 with a desired reference voltage. The replica circuit 7 is a replica of target circuits 6a and 6b. The output signal of the comparator 5 is inputted to an n-bit up-down counter 4. The up-down counter 4 is counted up or down in response to the output signal of the comparator 5, in synchronization with a clock signal 14. The up-down counter 4 generates an impedance control code 12 indicative of the counter value of the up-down counter 4, and provides the impedance control code 12 to the replica circuit 7. Thee resistance across the replica circuit 7 is controlled in response to the impedance control code 12. The impedance control code 12 is also fed to an anti-dithering circuit 3. The anti-dithering circuit 3 generates an anti-dithering impedance control code 13, and provides the anti-dithering impedance control code 13 for the target circuits 6a and 6b. The comparator 5, the up-down counter 4, and the replica circuit 7 provides a closed loop used for controlling the impedances of the target circuits 6a and 6b.

The conventional impedance control system 1, however, suffers from several problems.

A first problem is that the impedances of the target circuits 6a and 6b may be inaccurately controlled when the system 1 is subjected to a large power source noise or a large switching noise generated by other digital circuits. This problem may be been caused, because the comparator 5 continuously performs the comparison operation, and the impedance control code 12, which is fed to the replica circuit 7, is responsive to the comparison result of the comparator 5. When the comparator 5 receives a transient voltage noise at an input thereof, the output signal of the comparator 5 may be erroneously flipped. This may result in the impedance control code 12 is erroneously generated.

A second problem is that a non-binary code such as a thermometric code is necessarily used as the impedance control code 12 in order to avoid data transmission errors. This undesirably increases the circuit size and o the number of control signals within the impedance control system 1. This is because the use of a binary code is accompanied by impedance discontinuity when the impedance control code 12 is updated, considerably deteriorating the waveform of transmission signals. In the impedance control system 1, the impedance control code 12 is continuously updated by the closed loop, and the update of the impedance control code 12 is not synchronous with the data transmission.

SUMMARY OF THE INVENTION

In an aspect of the present invention, an impedance control system is composed of a target circuit having a controllable impedance; a replica circuit having a structure identical to the target circuit; a first binary counter providing the replica circuit with a first impedance control code indicative of a counter value of the first binary counter for controlling an impedance of the replica circuit; a comparator comparing a voltage received from the replica circuit with a reference signal; a second binary counter responsive to an output signal from the comparator for counting a number of times when said output signal is set to a predetermined state; and a control circuit extracting upper multiple bits out of a counter value of the second binary counter, and generating a second impedance control code indicative of the upper multiple bits The impedance of the target circuit is controlled in response to the second impedance control code.

The above-described architecture of the impedance control circuit allows optimally determining the second impedance code through averaging optimum impedance codes obtained by multiple measurements with a reduced circuit size, and thereby effectively reduces undesirable effects of external noise on the impedance control.

BRIEF DESCRIPTION OF THE DRAWINGS

The above and other advantages and features of the present invention will be more apparent from the following description taken in conjunction with the accompanied drawings, in which:

FIG. 3 is a table illustrating an exemplary operation of an impedance control circuit within the impedance control system, in the case when the impedance control circuit incorporates a 3-bit binary counter and a 5-bit binary counter.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

(Structure of Impedance Control System)

Figure 1:
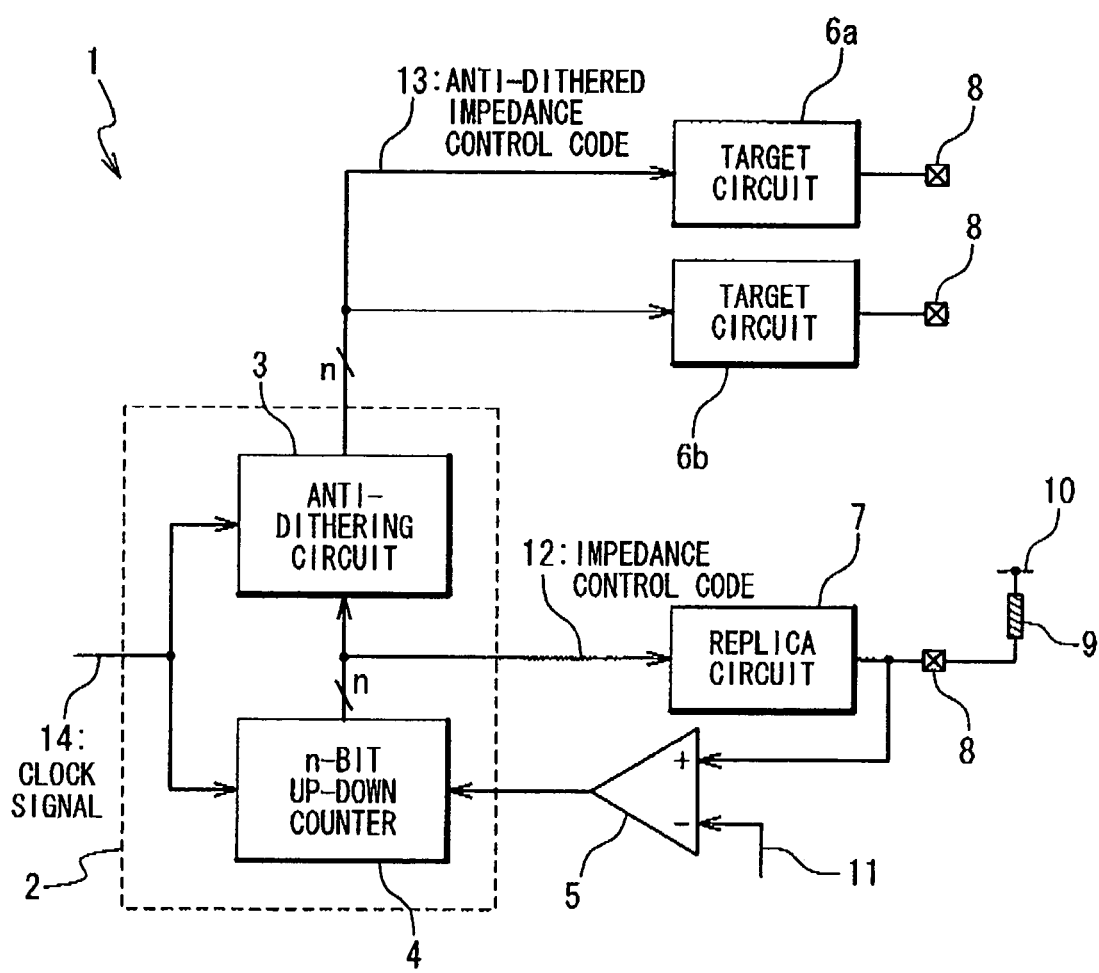
FIG. 1 is a circuit diagram illustrating an exemplary structure of a conventional impedance control circuit.
Figure 2:
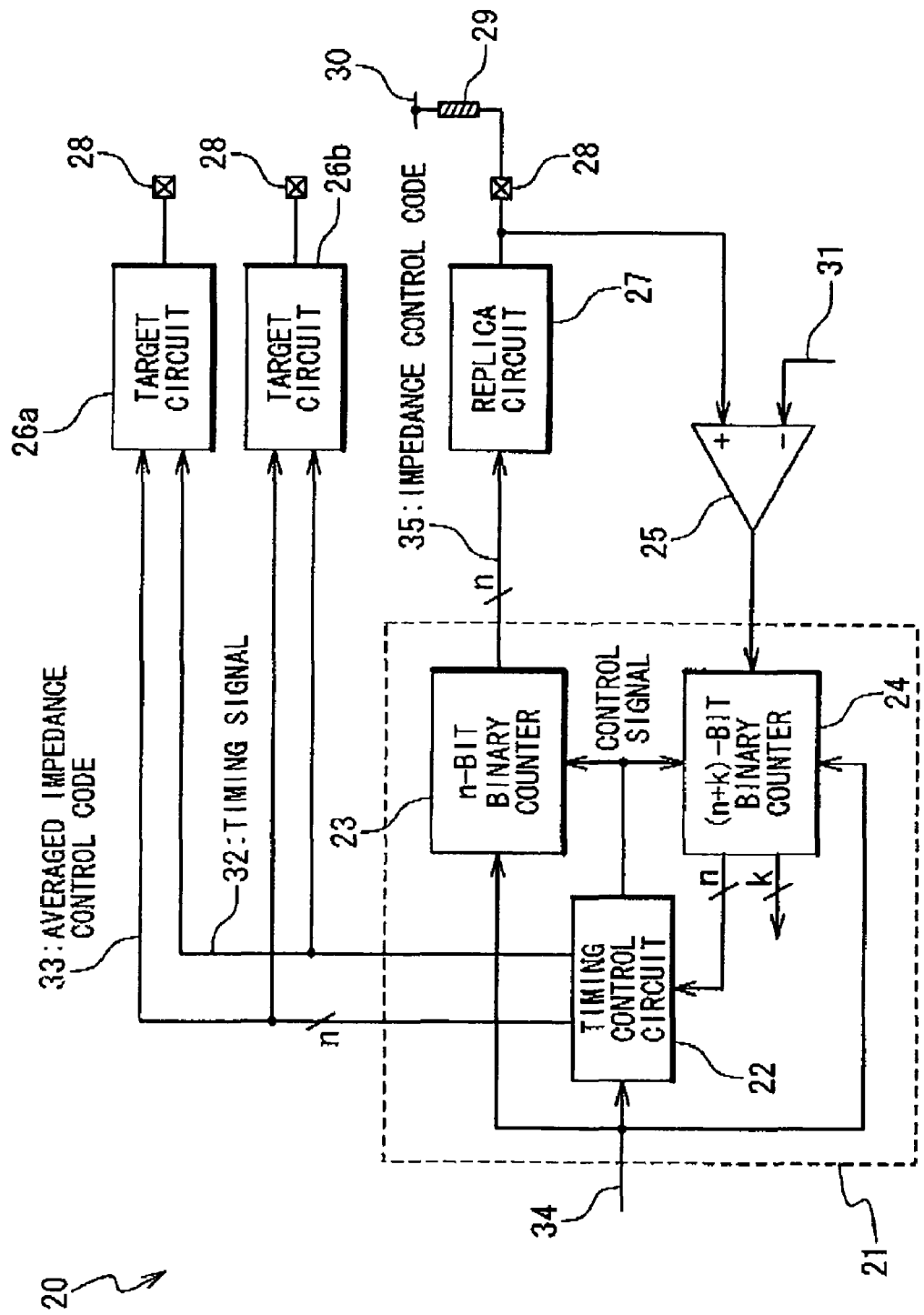
FIG. 2 is a circuit diagram illustrating an exemplary structure of an impedance control system in one embodiment of the present invention.

FIG. 2 illustrates an exemplary structure of an impedance control system 20 for controlling impedances of target circuits 26a and 26b. The impedance control system 20 is composed of an impedance control circuit 21, a comparator 25, a replica circuit 27, and pads 28a to 28c. The impedance control circuit 21, the comparator 25, the target circuits 26a and 26b, the replica circuit 27, and the pads 28a to 28c are monolithically integrated within a semiconductor chip. An external reference resistor 29 is connected between the pad 28c and a power supply terminal 30.

The impedance control circuit 21 includes an n-bit binary counter 23, an (n+k)-bit binary counter 24, and a timing control circuit 23.

The n-bit binary counter 23 is counted up or down in response to a clock signal 40. The n-bit binary counter 23 outputs an impedance control code 35 indicating the counter value contained in the n-bit binary counter 23 to the replica circuit 27.

The (n+k)-bit binary counter 24 is counted up in response to the output of the comparator 25. The (n+k)-bit binary counter 24 counts the number of times when said output signal is asserted; when the output of the comparator 25 is asserted (or set to logic "1"), the (n+k)-bit binary counter 24 is counted up in synchronization with the clock signal 34.

The timing control circuit 22 generates control signals to thereby control the binary counters 23 and 24. Additionally, the timing control circuit 22 receives upper n-bits of the (n+k)-bit counter value contained in the (n+k)-bit binary counter 24, and outputs an averaged impedance control code 33 indicating the upper n-bits to the target circuits 26a and 26n. The timing control circuit 22 operates synchronous with the clock signal 34.

The replica circuit 27 is a replica (or a duplicate) of the target circuits 26a and 26b; the structure of the replica circuit 27 is identical to those of the target circuits 26a and 26b. The replica circuit 27 connected to the pad 28c. The output impedance of the replica circuit 27 is controlled in response to the impedance control code 35 received from the n-bit binary counter 23. Specifically, the output impedance of the replica circuit 27 is decreased as the value of the impedance control code 35 is increased.

The comparator 25 compares the voltage developed on the output terminal of the replica circuit 27 with a reference voltage 31. The reference voltage 31 is adjusted in accordance with a desired impedance of the target circuits 26a and 26b. Specifically, the reference voltage 31 is adjusted to an expecting voltage on the pad 28c with the output impedance of the replica circuit 27 being identical to the resistance of the reference resistor 29. It should be noted that impedance matching between the replica circuit 27 and the reference resistor 29 is achieved when the output impedance of the replica circuit 27 is identical to the resistance of the reference resistor 29.

Specifically, the comparator 25 operates as follows: When the voltage on the output of the replica circuit 27 is higher than the reference voltage 31, the output signal of the comparator 25 is asserted (or set to logic "1"). Otherwise, the output signal of the comparator 25 is negated (or set to logic "0") The output signal of the comparator 25 is transmitted to the (n+k)-bit binary counter 24.

The target circuit 26a and 26b are designed so that the impedances thereof are controllable. In this embodiment, the target circuit 26a and 26b are driver circuits of NMOS open-drain structure, which incorporates parallel-connected NMOS transistors, each having a source connected to ground and a drain connected to the pad 28c. The NMOS transistors within the target circuit 26a and 26b are activated to function as driver elements in response to the averaged impedance control code 33. The number of the activated NMOS transistors is controlled by the averaged impedance control code 33, and thereby the output impedances of the target circuit 26a and 26b are decreased as the value of the averaged impedance control code 33 is increased.

(Operation of the Impedance Control System) The impedance control of the target circuit 26a and 26b is achieved as follows:

Initially, the timing control circuit 22 resets the (n+k)-bit binary counter 24. The timing control circuit 22 then controls the binary counters 23 and 24 in synchronization of the clock signal 34 as follows:

Step (a):

Firstly, the timing control circuit 22 sets the n-bit binary counter 23 to all "0", and allows the (n+k)-bit binary counter 24 to be counted up in response to the output signal of the comparator 25. Specifically, the (n+k)-bit binary counter 24 is counted up when the output signal of the comparator 25 is logic "1". When the output signal of the comparator 25 is logic "0", the counter value of the (n+k)-bit binary counter 24 remains unchanged.

Step (b):

The timing control circuit 22 increments the counter value of the binary counter 23 by one, and allows the (n+k)-bit binary counter 24 to be counted up in response to the output signal of the comparator 25 in the same way as the step (a).

Step (c):

The timing control circuit 22 repeats the same procedure as the step (b), until the counter value of the binary counter 23 is counted up to all "1" to complete a "scanning" of the binary counter 23. This results in that the counter value of the (n+k)-bit binary counter 24 is increased by the number of times of outputting logic "1" from the comparator 25 during the scanning. In other words, the counter value of the (n+k)-bit binary counter 24 is increased by an optimum value of the impedance control code 35 determined by the scanning, because the reference voltage 31 is adjusted in accordance with the desired impedance of the target circuits 26a and 26b.

It should be noted that the n-bit binary counter 23 may be scanned from all "1" to all "0" instead.

The steps (a) to (c) are repeated $2^k$ times; in other words, the n-bit binary counter 23 is scanned $2^k$ times from all "0" to all "1". This results in that the (n+k)-bit binary counter 24 contains the total number of the outputs of logic "1" from the comparator 25 during the $2^k$-times scannings of the counter value of the binary counter 23 from all "0" to all "1".

This is followed by generation of the averaged impedance control code 33 through extracting the upper n bits out of the (n+k)-bit counter value of the (n+k)-bit binary counter 24. The averaged impedance control code 33 thus generated has an optimum value, because the upper n bits indicate the average of the optimum values of the impedance control code 35 determined by the respective $2^k$-times scannings.

The averaged impedance control code 33 is then provided for the target circuit 26a and 26b. The averaged impedance control code 33 is accompanied by a timing signal 32, and the target circuit 26a and 26b latches the averaged impedance control code 33 at the timing indicated by the timing signal 32. The output impedances of the target circuit 26a and 26b are controlled in response to the averaged impedance control code 33. This allows the target circuit 26a and 26b to operate as driver circuits having a desired output impedance.

In order to improve controllability of the output impedances of the target circuit 26a and 26b, the bit width n of the binary counter 23 is preferably equal to or more than three. Additionally, the bit width (n+k) of the binary counter 23 is determined so that k is equal to or more than one.

In the impedance control system thus described, the optimum impedance control codes are determined $_2k$ times, and the impedance control code 33 is set to the average of the optimum impedance control codes thus determined. The output impedances of the target circuits 26a and 26b are controlled in response to the impedance control code 33 to achieve optimized impedance control. This effectively reduces the accidental error of the impedance control code 33 caused by noise. Even when the comparator 25 is subjected to spike noise, the effect on the output signal of the comparator 25 is reduced to one $2^k$-th through the averaging effect. The accidental error of the impedance control code 33 caused by random noise is reduced to $\sqrt{(1/2^k)}$ due to the statistical effect.

FIG. 3 illustrates an example of the operation of the impedance control system 20.

The impedance control operation begins with the first scanning of the n-bit binary counter 23 from all "0" to all "1". During the first scanning, the output signal of the comparator 25 is switched from logic "1" to logic "0" when the counter value of the n-bit binary counter 23 is incremented from "011b" to "100b". It should be noted that the symbol "b" indicates that the counter value is described in the binary notation. The number of times when the output signal of the comparator 25 is set to logic "1" during the first scanning is four, and accordingly, the counter value of the (n+k)-bit binary counter 24 is increased by four after the first scanning.

This is followed by the second scanning of the n-bit binary counter 23 from all "0" to all "1". During the second scanning, the output signal of the comparator 25 is switched from logic "1" to logic "0" when the counter value of the n-bit binary counter 23 is incremented from "100b" to "101b". The number of times when the output signal of the comparator 25 is set to logic "1" during the second scanning is five, and accordingly, the counter value of the (n+k)-bit binary counter 24 is increased by five after the second scanning.

Subsequently, the third scanning of the n-bit binary counter 23 from all "0" to all "1" is performed. During the third scanning, the output signal of the comparator 25 is switched from logic "1" to logic "0" when the counter value of the n-bit binary counter 23 is incremented from "011b" to "100b". Additionally, the output signal of the comparator 25 is accidentally flipped from logic "0" to logic "1" due to noise and the like, when the counter value of the n-bit binary counter is incremented from "100b" to "101b", and then gets back from logic "1" to logic "0" when the counter value of the n-bit binary counter is incremented from "101b" to "110b". The number of times when the output signal of the comparator 25 is set to logic "1" during the third scanning is five in total. Accordingly, the counter value of the (n+k)-bit binary counter 24 is increased by five after the third scanning.

Finally, the fourth scanning of the n-bit binary counter 23 from all "0" to all "1" is performed. During the fourth scanning, the output signal of the comparator 25 is switched from logic "1" to logic "0" when the counter value of the n-bit binary counter 23 is incremented from "010b" to "011b". Additionally, the output signal of the comparator 25 is accidentally flipped from logic "0" to logic "1" due to noise and the like, when the counter value of the n-bit binary counter 23 is incremented from "011b" to "100b", and then gets back from logic "1" to logic "0" when the counter value of the n-bit binary counter 23 is incremented from "100b" to "101b". The number of times when the output signal of the comparator 25 is set to logic "1" during the fourth scanning is four in total. Accordingly, the counter value of the (n+k)-bit binary counter 24 is increased by four after the fourth scanning.

The total number of times when the output signal of the comparator 25 is set to logic "1" over the first to fourth scannings is 18, and accordingly, the (n+k)-bit binary counter 24 contains a counter value of "10010b" after the first to fourth scannings.

The averaged impedance scanning code 33 is obtained by extracting the upper three bits out of the counter value of the (n+k)-bit binary counter 24. Since the two-bit right shift operation is equivalent to dividing by 4 ($=2^2$), the upper three bits indicates the average of the numbers of times when the output signal of the comparator 25 is set to logic "1" during the respective four scannings. In other words, the upper three bits indicates the average of the optimum impedance control codes determined by the respective scannings. Therefore, providing the target circuits 26a and 26b with the averaged impedance scanning code 33 thus obtained effectively achieves optimum control of the output impedances of the target circuits 26a and 26b.

Although the output signal of the comparator 25 is susceptive to external random noise especially when the counter value of the n-bit binary counter 23 is near to the optimum impedance control code, the averaging of the optimum impedance control codes obtained by the respective four scannings effectively suppresses undesirable effects of the random noise. In the operation thus described, the effect of the random noise is reduced to half of the case when the optimum impedance control code is obtained by a single scanning of the n-bit binary counter 23, through the statistical effect.

Notedly, the averaging is achieved by a size-reduced circuitry; the averaging thus described requires only one three-bit binary counter, and one five-bit binary counter. This effectively reduces the circuit size and manufacture cost of the impedance control circuit 21.

In an alternative preferred embodiment, the scannings of the counter value of the n-bit binary counter 23 are preferably performed so that scannings from all "0" to all "1" and scannings from all "1" to all "0" are alternately performed. In one embodiment, for example, the first and third scannings are performed from all "0" to all "1" by incrementing the counter value of the n-bit binary counter 23, while the second and fourth scannings are performed from all "1" to all "0" by decrementing the counter value of the n-bit binary counter 23. This allows canceling the effect of the hysteresis characteristics of the comparator 25, and thereby determining the averaged impedance control code 33 more accurately.

In summary, the present invention achieves impedance matching between a semiconductor device and a transmission line for the high speed interfacing, such as SerDes, with reduced circuit size and cost.

Although the impedance control system 20 is described above, which is designed to control the output impedance of the target circuits 26a and 26b, it should be noted that the present invention is applicable to control of the impedances of other circuits. For example, the present invention is applicable to control of an output impedance of a driver (or transmitter) and an input impedance of a receiver within a high-speed interface circuit. In a preferred embodiment, the present invention is applied to a SerDes driver circuitry. In this case, the target circuits 26a and 26b are designed to function as SerDes drivers, and the output impedances of the SerDes drivers are controlled by the impedance control circuit 21. In another preferred embodiment, the present invention is applied to a SerDes receiver circuitry. In this case, the target circuits 26a and 26b are designed to function as SerDes receivers, and the input impedances of the SerDes receivers are controlled by the impedance control circuit 21.

It is apparent that the present invention is not limited to the above-described embodiments, which may be modified and changed without departing from the scope of the invention.

What is claimed is:

1. An impedance control system comprising:
    a target circuit having a controllable impedance;
    a replica circuit having a structure identical to said target circuit;
    a first binary counter providing said replica circuit with a first impedance control code indicative of a counter value of said first binary counter, wherein an impedance of said replica circuit is controlled in response to said first impedance control code;
    a comparator comparing a voltage received from said replica circuit with a reference signal;
    a second binary counter responsive to an output signal from said comparator for counting a number of times when said output signal is set to a predetermined state; and
    a control circuit extracting upper multiple bits out of a counter value of said second binary counter, and generating a second impedance control code indicative of said upper multiple bits,
    wherein said impedance of said target circuit is controlled in response to said second impedance control code.

2. The impedance control system according to claim 1, wherein said counter value of said first binary counter consists of n bits, and said counter value of said second binary counter consists of n+k bits, where n is an integer equal to or more than three, and k is an integer equal to or more than one.

3. The impedance control system according to claim 2, wherein said control circuit is configured to control said first binary counter so that said first binary counter is scanned $2^k$ times from all "0" to all "1", or from all "1" to all "0", and to generates said second impedance control code so as to indicate of upper n bits of said counter value of said second binary counter.

4. The impedance control system according to claim 1, wherein said control circuit is configured to control said first binary counter so that said first binary counter is counted up from all "0" to all "1" during a first scanning of said first binary counter, and counted down from all "1" to all "0" during a second scanning of said first binary counter following said first scanning.

5. An impedance control circuit comprising:
    a first binary counter providing a replica circuit of a target circuit having a controllable impedance a first impedance control code indicative of a counter value of said first binary counter, for controlling an impedance of said replica circuit;
    a second binary counter responsive to an output signal from a comparator comparing a voltage received from said replica circuit with a reference signal for counting a number of times when said output signal is set to a predetermined state; and
    a control circuit extracting upper multiple bits out of a counter value of said second binary counter, and generating a second impedance control code indicative of said upper multiple bits for controlling an impedance of said target circuit.

6. The impedance control circuit according to claim 5, wherein said counter value of said first binary counter consists of n bits, and said counter value of said second binary counter consists of n+k bits, where n is an integer equal to or more than three, and k is an integer equal to or more than one.

7. The impedance control circuit according to claim 6, wherein said control circuit is configured to control said first binary counter so that said first binary counter is scanned $2^k$ times from all "0" to all "1", or from all "1" to all "0", and to generates said second impedance control code so as to indicate upper n bits of said counter value of said second binary counter.

8. The impedance control circuit according to claim 5, wherein said control circuit is configured to control said first binary counter so that said first binary counter is counted up from all "0" to all "1" during a first scanning of said first binary counter, and counted down from all "1" to all "0" during a second scanning of said first binary counter following said first scanning.

9. A semiconductor device comprising:
a target circuit having a controllable impedance;
a replica circuit having a structure identical to said target circuit;
a first binary counter providing said replica circuit with a first impedance control code indicative of a counter value of said first binary counter, wherein an impedance of said replica circuit is controlled in response to said first impedance control code;
a comparator comparing a voltage received from said replica circuit with a reference signal;
a second binary counter responsive to an output signal from said comparator counting a number of times when said output signal is set to a predetermined state; and
a control circuit extracting upper multiple bits out of a counter value of said second binary counter, and generating a second impedance control code indicative of said upper multiple bits,
wherein said impedance of said target circuit is controlled in response to said second impedance control code, and
wherein said target circuit, said replica circuit, said first binary counter, said second binary counter, and said control circuit are monolithically integrated within a semiconductor chip.

10. A SerDes driver circuitry comprising:
a SerDes driver having a controllable output impedance;
a replica circuit having a structure identical to said SerDes driver;
a first binary counter providing said replica circuit with a first impedance control code indicative of a counter value of said first binary counter, wherein an output impedance of said replica circuit is controlled in response to said first impedance control code;
a comparator comparing a voltage received from said replica circuit with a reference signal;
a second binary counter responsive to an output signal from said comparator for counting a number of times when said output signal is set to a predetermined state; and
a control circuit extracting upper multiple bits out of a counter value of said second binary counter, and generating a second impedance control code indicative of said upper multiple bits,
wherein said output impedance of said SerDes driver is controlled in response to said second impedance control code.

11. A SerDes receiver circuitry comprising;
a SerDes receiver having a controllable input impedance;
a replica circuit having a structure identical to said SerDes receiver;
a first binary counter providing said replica circuit with a first impedance control code indicative of a counter value of said first binary counter, wherein an input impedance of said replica circuit is controlled in response to said first impedance control code;
a comparator comparing a voltage received from said replica circuit with a reference signal;
a second binary counter responsive to an output signal from said comparator for counting a number of times when said output signal is set to a predetermined state; and
a control circuit extracting upper multiple bits out of a counter value of said second binary counter, and generating a second impedance control code indicative of said upper multiple bits,
wherein said input impedance of said SerDes receiver is controlled in response to said second impedance control code.

12. A method of controlling an impedance of a target circuit, comprising:
scanning a counter value of a first binary counter between all "0" and all "1" to generate a first impedance control code;
controlling an impedance of a replica circuit having a structure identical to said target circuit;
comparing a voltage received from said replica circuit with a reference signal by a comparator to generate an output signal;
counting up or down a second binary counter in response to said output signal;
extracting upper multiple bits out of a counter value of said second binary counter to generate a second impedance control code indicative of said upper multiple bits; and
controlling said impedance of said target circuit in response to said second impedance control code.

13. The method according to claim 12, wherein said counter value of said first binary counter consists of n bits, and said counter value of said second binary counter consists of n+k bits, where n is an integer equal to or more than three, and k is an integer equal to or more than one.

14. The method according to claim 13, wherein said scanning of said counter value of said first binary counter is repeated $2^k$ times every when a value of said second impedance control code is determined.

15. The method according to claim 12, wherein said scanning includes:
counting up said first binary counter from all "0" to all "1"; and
counting down said first binary counter from all "1" to all "0", and
wherein said counting up and counting down are alternately performed.

* * * * *